United States Patent
Wake et al.

(10) Patent No.: US 6,319,801 B1
(45) Date of Patent: Nov. 20, 2001

(54) METHOD FOR CLEANING A SUBSTRATE AND CLEANING SOLUTION

(75) Inventors: Tomoko Wake; Hidemitsu Aoki, both of Toyko (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/201,137

(22) Filed: Nov. 30, 1998

(30) Foreign Application Priority Data

Nov. 28, 1997 (JP) ........................................... 9-328675

(51) Int. Cl.⁷ .................... H01L 21/302; C11D 07/26; C11D 07/32; C11D 07/50; B23K 1/00; C23G 1/02

(52) U.S. Cl. ............... 438/585; 134/2; 438/906

(58) Field of Search ..................... 438/690, 691, 438/963, 585, 906

(56) References Cited

U.S. PATENT DOCUMENTS

| | | | |
|---|---|---|---|
| 5,700,383 | * 12/1997 | Feller et al. | 438/692 |
| 5,858,813 | * 1/1999 | Scherber et al. | 438/693 |
| 5,911,835 | * 6/1999 | Lee et al. | 134/1.3 |
| 5,989,353 | * 11/1999 | Skee et al. | 134/2 |

FOREIGN PATENT DOCUMENTS

| | | | |
|---|---|---|---|
| 5-259140 | * | 10/1993 | (JP) . |
| 7-37846 | * | 2/1995 | (JP) . |
| 7-297158 | * | 11/1995 | (JP) . |
| 8-187475 | * | 7/1996 | (JP) . |
| 9-157692 | * | 6/1997 | (JP) . |
| 9-181028 | * | 7/1997 | (JP) . |
| 9-246222 | * | 9/1997 | (JP) . |

* cited by examiner

Primary Examiner—Mary Wilczewski
(74) Attorney, Agent, or Firm—Young & Thompson

(57) ABSTRACT

A method for cleaning a substrate having a patterned metal layer formed thereon includes the step of removing metallic contaminants from the substrate by use of an aqueous solution of carboxylic acid having a chelating action. The aqueous solution contains one of water-soluble carboxylic acid, ammonium carboxylate, and carboxylic acid having an amino group and the the water-soluble carboxylic acid is one of acetic acid, formic acid, citric acid, and oxalic acid. The patterned metal layer is made of one of a transition metal and a compound of a transition metal with one of Si (silicon), N (nitrogen) and O (oxygen).

16 Claims, 4 Drawing Sheets

BEFORE CLEANING

AFTER CLEANING ACCORDING TO THE INVENTION

BEFORE CLEANING

AFTER CLEANING

BEFORE CLEANING

AFTER CLEANING
ACCORDING TO THE INVENTION

METHOD FOR CLEANING A SUBSTRATE AND CLEANING SOLUTION

BACKGROUND OF THE INVENTION

1. Field of the Invention

The present invention generally relates to a method of cleaning a substrate having a patterned metal layer formed thereon and in particular to a cleaning method and a cleaning solution for removing metallic contaminants adhering to the substrate on which a metal layer has been formed by fine and high-density patterning.

2. Description of the Related Art

In recent years, as devices are becoming denser, substrates having thin-film multilayered structure, such as a semiconductor substrate, a liquid crystal substrate, a printed substrate for electronic devices and a substrate having magnetic materials, are subjected to fine processing of the multilayered films.

In particular, semiconductor devices become highly dense and gate electrodes thereof are made fine. For this, low-resistant suicide materials (WSix, TiSix) or metal materials such as tungsten (W) etc., or multilayered structure having TiN, WN sandwiched between W or WSix film or TiSix film came to be used as a gate electrode material.

FIG. 1 shows the schematic structure of a thin-film transistor. After a gate oxide film ($SiO_2$) 2 is formed on a Si (silicon) substrate 1, a film of metal is deposited on the gate oxide film 2. The film of metal is finely patterned by dry etching to form a gate electrode 3. Thereafter, a source region 4 and a drain region 5 are formed in the substrate 1 by ion implantation.

In these steps, metallic contaminants 6 such as Fe. Al etc. are generated from the dry etching apparatus and the ion implanter and adhere to the surface of the gate oxide film 2. The metallic contaminants 6 on the gate oxide film 2 diffuse into the Si substrate 1 through the gate oxide film 2 in a subsequent thermal treatment step. This causes leak current to occur readily in the channel region under the gate electrode 3, or to reduce the maximum permissible voltage between the source region and the drain region, resulting in deterioration in the reliability of the device.

Accordingly, it is necessary to remove the metallic contaminants 6 from the surface of the gate oxide film 2, and after dry etching of the film of metal on the gate oxide film 2 and after ion implantation, a cleaning treatment using an acidic cleaning solution is applied so that the metallic contaminants 6 developed during these steps are removed from the surface of the gate oxide film 2.

Usually, In the semiconductor process using a Si substrate, SPM (sulfuric acid-hydrogen peroxide mixture) or HPM (hydrochloric acid-hydrogen peroxide-water mixture) is mainly used as a cleaning solution for removing metallic contaminants.

Liquid crystals and printed substrates are rarely cleaned with an acidic cleaning solution and are cleaned with an organic solution such as IPA (isopropyl alcohol).

However, the conventional acidic cleaning solutions (SPM, HPM) used for removal of metallic contaminants have the problem of their possible etching of materials constituting the gate electrode 3.

In particular, TiN and W among metal wiring materials used as low-resistance gate are easily etched with these acidic solutions, so these cannot be used for cleaning treatment.

As shown in FIG. 2A, for example, the gate electrode 3 is a DRAM gate electrode composed of multilayered films such that a poly-sillcon layer 7 is formed on the gate oxide film 2 and a silicide (Tiix) layer 8 and a nitride film (TiN) 9 are sequentially deposited on the poly-silicon layer 7. If the cleaning solution SPM or HPM is used for removal of metallic contaminants developed after dry etching or after ion implantation, then the side wall of the nitride film (TiN) 8 is etched as shown in FIG. 2B, so the multilayered structure cannot be maintained and the gate electrode and the wiring may be removed.

Further, when DHF (fluoric acid-aqueous system-water mixture) effective for removal of metals is used as the cleaning solution, the silicide layer (TiSix) 9 is greatly etched and the gate oxide film ($SiO_2$) 2 is also etched, so DHF cannot be used.

As described above, as the integration of semiconductor devices advances, the width of the gate electrode is also made fine, so the amount of material etched by treatment with the conventional acidic cleaning solution cannot be neglected, and there was need for a cleaning solution capable of removing metal contamination without etching low-resistance metal materials.

SUMMARY OF THE INVENTION

The present invention was made in view of these circumstances, and the object of the invention is to provide a cleaning method for removal of metallic contaminants from the surface of a substrate without etching any patterned metal material formed thereon in the treatment of cleaning the substrate, as well as the cleaning solution used in this method.

According to the present invention, an aqueous solution having a chelating action with metals such as iron (Fe), aluminum (Al) etc., is used as a cleaning solution for removal of metallic contaminants. More specifically, a carboxylic acid having a chelating action may by used as the cleaning solution. That is, the cleaning solution may be composed of an aqueous solution containing one of water-soluble carboxylic acid such as acetic acid, formic acid, citric acid, oxalic acid etc., ammonium carboxylate, and carboxylic acid having amino group. A chelating agent may be added to the carboxylic acid having a chelating action so as to enhance the chelating action with metals.

The cleaning method according to the present invention is comprised of the step of removing metallic contaminants from the surface of a substrate having a patterned metal layer formed thereon with the cleaning solution.

The material constituting the patterned metal layer is Ti (titanium), W (tungsten), Co (cobalt), Ni (nickel) or Ta (tantalum), or a compound consisting of each of these transition metals with Si (silicon), N (nitrogen) or O (oxygen), so that metallic contaminants can be removed certainly without etching the patterned metal layer.

For example, in the case where a gate oxide film is formed on a semiconductor substrate and then a gate electrode is formed thereon, the carboxylic acid and amino group added to the cleaning solution form a complex by chelating action with metals such as Fe, Al etc., so that the metallic contaminants attached to the gate oxide film can be removed.

The metallic contaminants In this case are often chemically or physically adsorbed onto the surface oxide film in the form of metal oxides or metal atoms. According to the present invention, the adsorbed metallic contaminants can be easily captured and removed by chelating action.

On the other hand, the metal material of the gate electrode makes strong intermetallic bonding, so there is no or less possibility that this bonding is cleaved and removed by the chelating action of the cleaning solution. Accordingly, even if the cleaning solution according to the invention is used for cleaning treatment, the portion of the gate electrode is hardly etched.

DETAILED DESCRIPTION OF THE PREFERRED EMBODIMENT

An example of a cleaning solution and a cleaning method by use of the cleaning solution according to the present invention will be hereinafter described.

The inventors found that an aqueous solution of oxalic acid t(1%) having a chelating agent added thereto (hereinafter, denoted by 1-percent aqueous oxalic acid) is suitable for removing metallic contaminants from the surface of a substrate without etching a metal layer formed on the substrate.

Concretely, one of the following chelating agents is added to the aqueous solution having the oxalic-acid concentration of 1 percent: aminopolycarboxylic acid such as ethylenediamlnetetraacetic acid (EDTA) and trans-1,2-diamlnocyclohexanetetraacetic acid (CyDTA); phosphonic acid such as ethylenediaminetetra (methylenephosphonate) (EDTPO), ethylenediaminedi (methylenephosphonate) (EDDPO), nitrilotris (methylenephosphonate)(NTPO), and 1-hydroxyethyrlidene-1,1'diphosphonic acid (HEDPO); condensed phosphate such astriphosphoric acid and hexametaphosphatic acid; diketone such as acetylacetone and hexafluoroacetylacetone; amine such as ethylenediamine and triethanolamine; a compound of an inorganic ion such as halogenide ion ($F^-$, $Cl^-$, $Br^-$, $I^-$), cyanide ion, thiocyanate ion, thiosulfate ion and ammonium ion; and ammonium salt thereof. Especially, EDTA, CyDTA, EDTPO, EDDPO, NTPO and HEDPO are preferably used.

The cleaning solution may be produced by use of only a carboxylic acid having the chelating action such as oxalic acid. In this embodiment, to enhance the chelating action, a chelating agent selected from the above chelating agents is added to the oxalic acid solution (1%). More specifically, EDNA is used as a chelating agent and about 30 ppm EDTA is added to the oxalic acid solution (1%) to produce the cleaning solution (1-percent aqueous oxalic acid).

Figure 3:
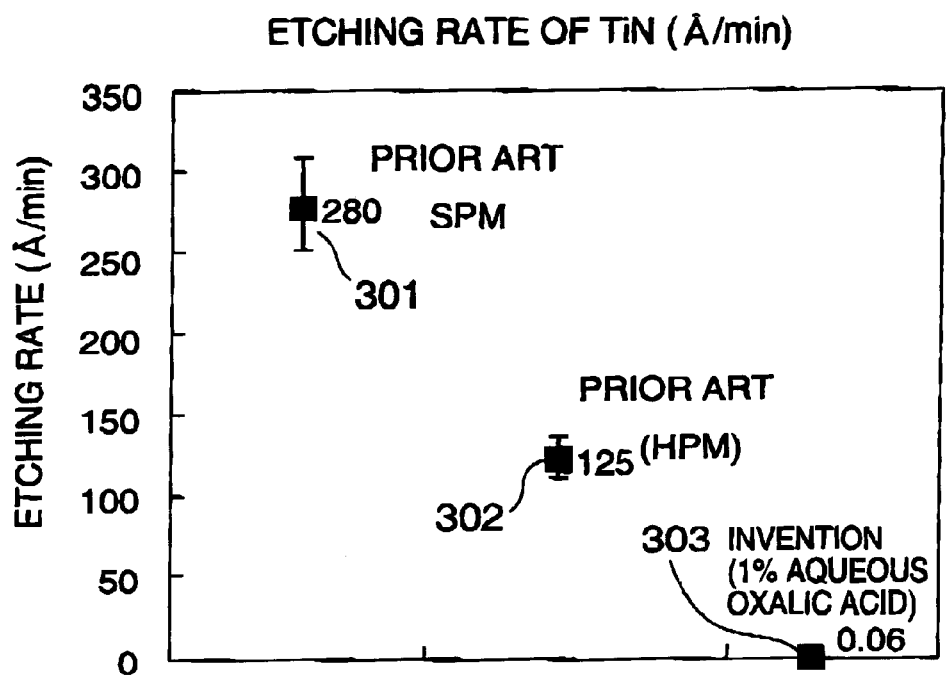
FIG. 3 is a graph showing etching rates of TiN film in the respective cases of using SPM, HPM and a cleaning solution according to an embodiment of the invention.

As shown in FIG. 3, the etching rates of this cleaning solution (1-percent aqueous oxalic acid) and the conventional cleaning solutions SPM and HPM with respect to TiN film were measured respectively, and the results are shown in FIG. 3. The TiN film is used as sub-layer in a multilayered gate of DRAM.

As can be found from FIG. 3, the conventionally used cleaning solutions SPM and HPM exhibit etching rates as extremely high as 6 nm/min or more with respect to the TiN film as indicated by reference numerals 301 and 302, respectively.

On the other hand, the present cleaning solution having a chelating agent added to an aqueous solution of oxalic acid (1%) exhibits an etching rate of 0.1 nm/min or less as indicated by reference numeral 303, thus hardly causing etching.

Then, this cleaning solution (1-percent aqueous oxalic acid) and the conventionally used cleaning solutions SPM and RPM were examined for the effect of removing Fe contamination.

Figure 4:
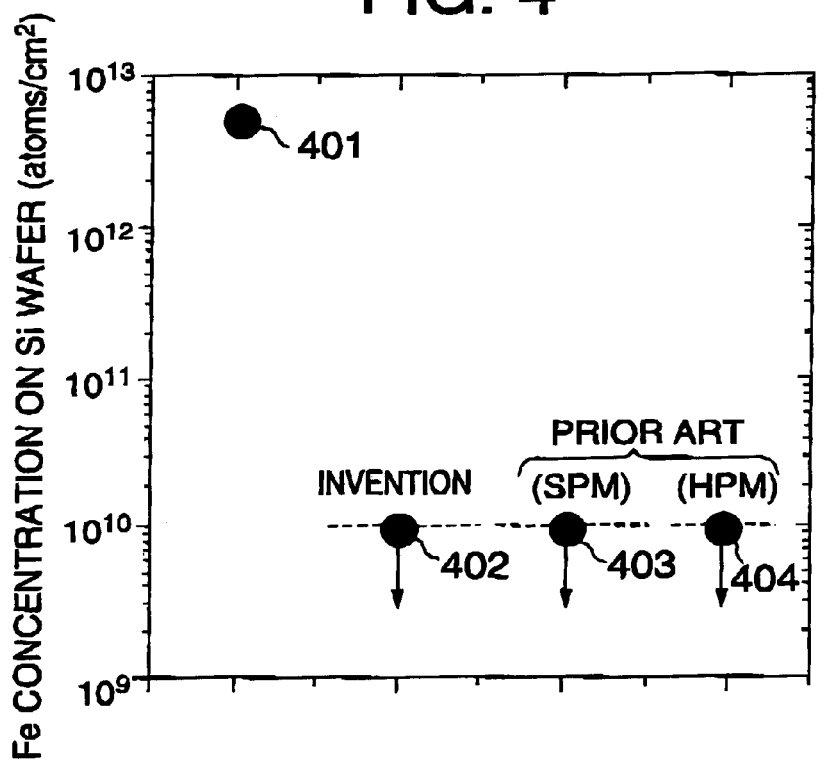
FIG. 4 is a graph showing comparison of the cleaning solution according to an embodiment of the invention, SPM, and HPM with respect to the effect of removing Fe contamination.

As shown in FIG. 4, the Si substrate (silicon wafer) having metallic contaminants (Fe contamination) adhering thereto was subjected to cleaning treatment with each cleaning solution, and the Fe concentration on the surface after the cleaning treatment was measured. The results are shown in FIG. 4.

Referring to FIG. 4, the Fe concentration before cleaning treatment is about $5 \times 10^{12}$ atoms/$cm^2$ as indicated by reference numeral 401. The initial Fe concentration of $5 \times 10^{12}$ atoms/$cm^2$ could be reduced to $10^{10}$ atoms/$cm^2$ or less after cleaning with the cleaning solution having a chelating agent added to an aqueous solution of oxalic acid (1%) as indicated by reference numeral 402. The similar effect can be obtained by cleaning treatment with the conventional cleaning solutions SPM and HPM as indicated by reference numerals 403 and 404, respectively.

From the measurement results as shown in FIGS. 3 and 4, it is expected that the metallic contaminants (Fe contamination) remaining on the surface can be removed without etching the TiN film by cleaning treatment with the cleaning solution having a chelating agent added to an aqueous solution of oxalic acid (1%)

Now, there is described the method of cleaning a semiconductor substrate with the cleaning solution having a chelating agent added to an aqueous oxalic acid solution (1%), that is, the 1-percent aqueous oxalic acid.

Figure 5A:
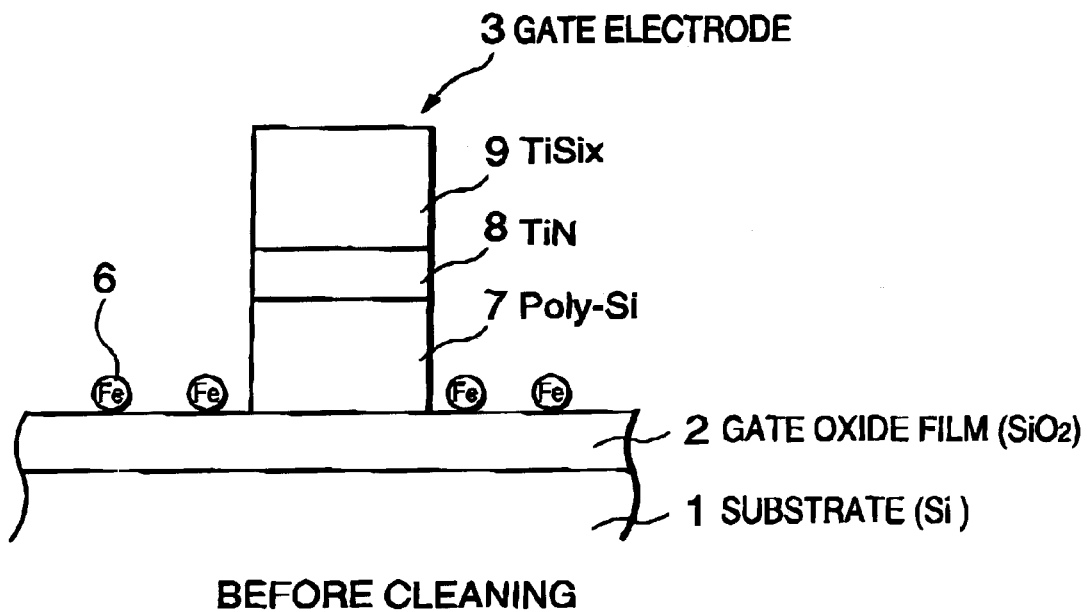
FIG. 5A is a diagram showing an example of a thin-film field-effect transistor having multilayered gate electrode formed on a gate oxide film before cleaning treatment with a cleaning solution according to an embodiment of the present invention.

Referring to FIG. 5A, a silicon substrate 1 has a gate oxide film 2 of 5 nm in thickness deposited thereon and then a gate electrode 3 or a patterned metal layer is formed thereon. More specifically, there are sequentially formed a poly-Si film (polycrystalline silicon film) 7 of 100 nm in thickness, a TiN (titanium nitride) film 8 of 10 nm in thickness, and a TiSix film 9 of 200 nm in thickness on the gate oxide film 2 in this order. Thereafter, these layers are patterned by dry etching to form the multilayered gate electrode 3.

As described before, upon dry etching of the multilayered film, Fe contaminants 6 remains on the surface of the gate oxide film 2.

Figure 5B:
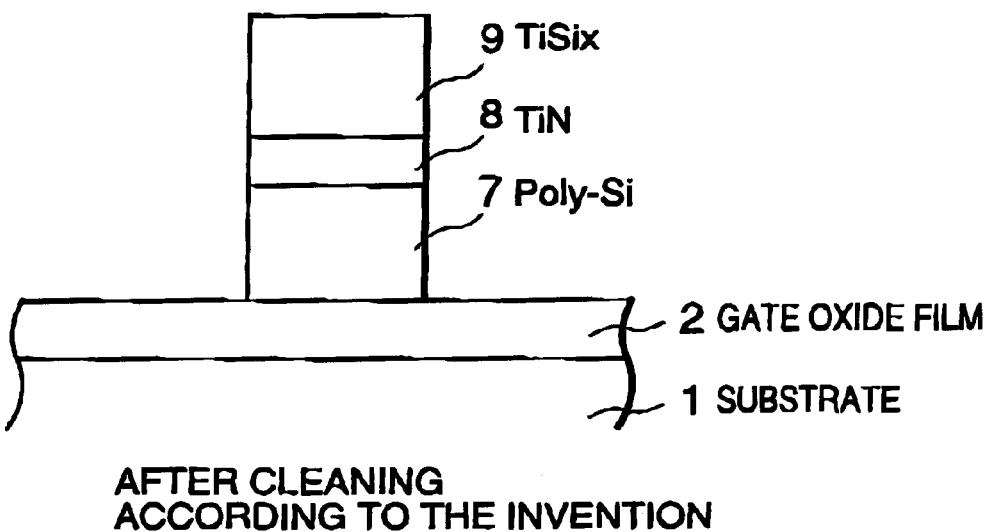
FIG. 5B is a diagram showing the thin-film field-effect transistor of FIG. 5A after cleaning treatment with the cleaning solution according to the embodiment.

To remove the metallic contaminants from the gate oxide film 2 after dry etching, the cleaning solution (the 1-percent aqueous oxalic acid) was used to conduct cleaning treatment for 5 minutes. Because the side-etched amount of the TiN film 8 can be regulated within 0.5 nm or less, so the sectional shape of the gate electrode 3 after the cleaning treatment shape hardly changed, compared with that before the treatment, as shown in FIG. 5B.

Figure 1:
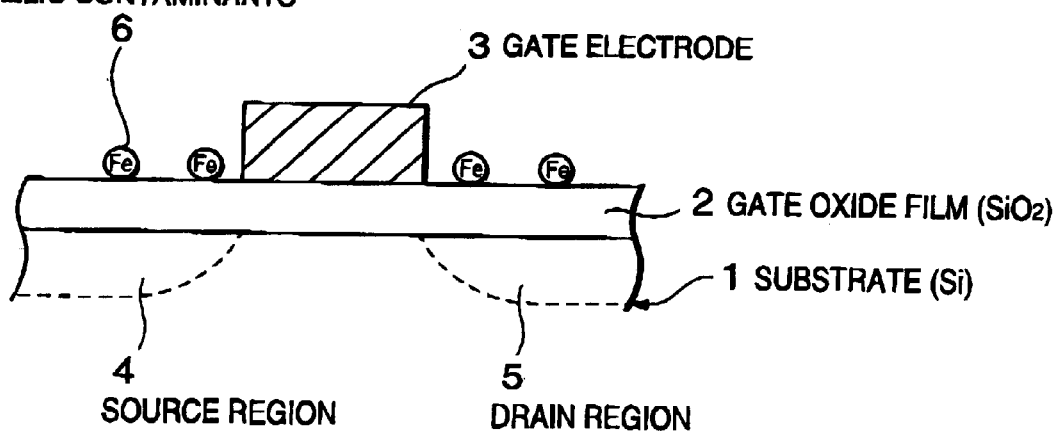
FIG. 1 is a diagram showing an example of a thin-film field-effect transistor.
Figure 2A:
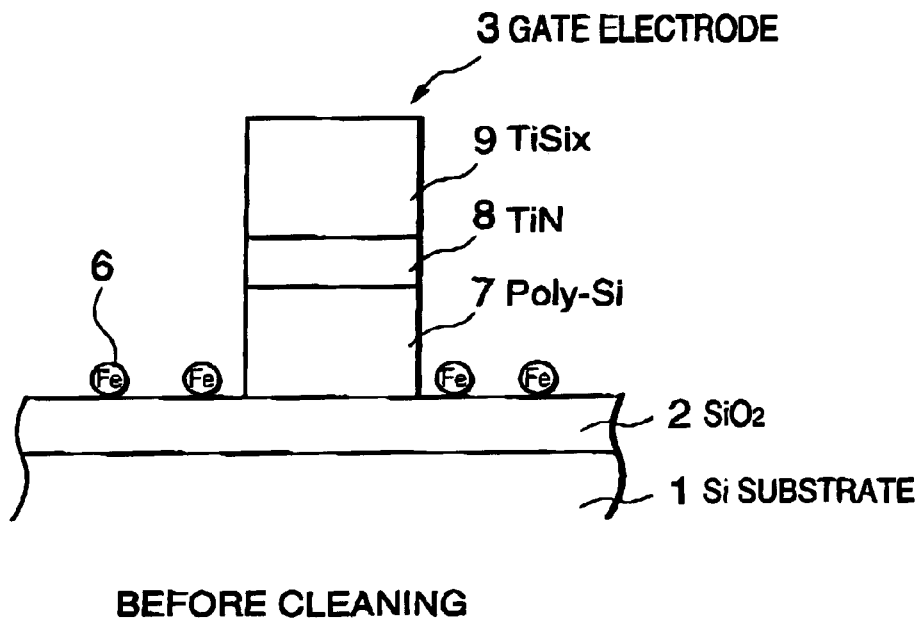
FIG. 2A is a diagram showing another example of a thin-film field-effect transistor having multilayered gate electrode formed on a gate oxide film before cleaning treatment with a conventional cleaning solution.
Figure 2B:
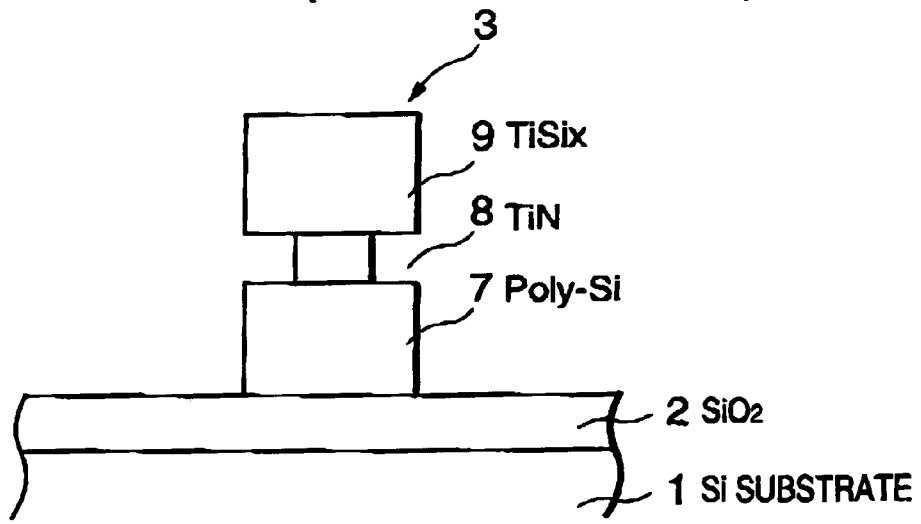
FIG. 2B is a diagram showing the thin-film field-effect transistor of FIG. 2A after cleaning treatment with the conventional cleaning solution.

In contrast, if the conventional cleaning solution (HPM) was used to conduct cleaning treatment for 5 minutes, the etching rate of particularly the TiN film 8 is rapid, so the side etching of 30 run occurs at the Bide of the TiN film 8 as shown in FIG. 2B, and the multilayered structure of the gate electrode 3 cannot be maintained. Therefore, there are cases where the TiSi film (silicide material) 9 may be removed.

As a result of cleaning treatment. Fe contamination remaining on the surface of the gate oxide film 2 could be reduced from the level of $3 \times 10^{10}$ atoms/cm$^2$ after dry etching treatment to the level of $1 \times 10^{10}$ atoms/cm$^2$ or less after cleaning treatment, and this level was equivalent to that achieved by cleaning treatment with the conventional solution.

According to the embodiment described above, the semiconductor substrate with the gate electrode 3 formed thereon is cleaned with the cleaning solution (the 1-percent aqueous oxalic acid) whereby the etching of the gate electrode material is inhibited. Therefore, the shape of the gate electrode 3 is thereby maintained while the metallic contaminants are removed without reducing in the reliability of the device.

Further, the metallic contaminants can be removed from the whole surface of the semiconductor substrate (silicon wafer), so in the subsequent processes for producing semiconductor devices, cross contamination can be inhibited, and production of highly reliable devices is made feasible.

Although the aqueous solution of oxalic acid was used as the cleaning solution in the example described above, it may be a water-soluble carboxylic acid such as acetic acid, formic acid, citric acid or the like. Further, an aqueous solution containing one of ammonium salt of one of these carboxylic acids and carboxylic acid having amino group may be used.

Although the gate electrode 3 having a multilayered structure (here, TiSix/TiN) has been described as an example of the gate electrode to be cleaned, metal exposed on the substrate is not limited to a specific portion of the electrode or wire. The cleaning treatment according to the present invention is also effective for the substrate on which a patterned metal layer has been formed.

The type of metal used as the metal layer may be a transition metal such as Ti (titanium), W (tungsten), Co (cobalt), Ni (nickel) or Ta (tantalum), or a compound of this transition metal with S; (silicon), N (nitrogen) or O (oxygen). Further, it may be TiSix, TiN, TiOx, WNx, WOx, CoSix, CoNx, NiSix, NiNx, NiOx, TaSix, TaNx or TaOx. Any of the metals or compounds described above can be used as the material constituting the gate electrode 3 so that the metallic contaminants adhering to the substrate can be certainly removed without etching the gate electrode in cleaning treatment according to the present invention.

As a result, the adverse effect of the etching of the gate electrode on the switching characteristics of transistors does not occur, and by removing the metallic contaminants from the gate oxide film, the generation of leak at a conjunction of transistors can also be prevented.

According to the present invention, metallic contaminants remaining on a substrate can be removed without etching a metal layer formed on the substrate by cleaning treatment of the substrate with an aqueous solution containing one of water-soluble carboxylic acid, ammonium carboxylate, and carboxylic acid having amino group.

We claim:
1. A method of cleaning metallic contamination from a gate oxide film during formation of a transistor on a semiconductor substrate, the method comprising the steps of:
   forming a gate electrode for the transistor on the gate oxide film, the gate electrode having a metallic portion and the gate oxide film having metallic contamination thereon; and
   after forming the gate electrode and before thermally treating the substrate, washing the gate oxide film with a cleaning solution consisting essentially of an aqueous solution of a carboxylic acid that has a chelating action to remove the metallic contamination from the gate oxide film.

2. The method of claim 1, wherein a concentration of the carboxylic acid is 1%.

3. The method according to claim 2, wherein the water-soluble carboxylic acid is one of acetic acid, formic acid, citric acid, and oxalic acid.

4. The method of claim 1, wherein the metallic portion of the gate electrode comprises one of a transition metal and compound of a transition metal with one of silicon, nitrogen, and oxygen.

5. The method according to claim 4, wherein the transition metal is one selected from a group consisting of titanium, tungsten, cobalt, nickel and tantalum.

6. The method of claim 1, wherein the gate electrode comprises layers of polysilicon, the metallic portion, and a silicide.

7. The method of claim 6, wherein the metallic portion is selected from the group consisting of titanium, tungsten, cobalt, nickel, and tantalum.

8. The method of claim 1, wherein the step of forming the gate electrode comprises the step of dry etching layers of polysilicon, the metallic portion, and a silicide.

9. The method of claim 1, further comprising the step of implanting ions into the substrate before the washing step.

10. The method of claim 1, wherein the aqueous solution of carboxylic acid includes one of watersoluble carboxylic acid, ammonium carboxylate, and carboxylic acid having an amino group.

11. The method of claim 1, wherein the aqueous solution of carboxylic acid is a 1% oxalic acid solution.

12. A method of cleaning metallic contamination from a gate oxide film during formation of a transistor on a semiconductor substrate, the method comprising the steps of:
   forming a gate electrode for the transistor on the gate oxide film, the gate electrode having a metallic portion and the gate oxide film having metallic contamination thereon; and
   after forming the gate electrode and before thermally treating the substrate, washing the gate oxide film with a cleaning solution consisting essentially of an aqueous solution of a carboxylic acid that has a chelating action and a chelating agent to remove the metallic contamination from the gate oxide film.

13. The method of claim 12, wherein the aqueous solution of carboxylic acid includes one of water-soluble carboxylic acid, ammonium carboxylate, and carboxylic acid having an amino group.

14. The method of claim 12, wherein a concentration of the carboxylic acid is 1%.

15. The method of claim 12, wherein the aqueous solution of carboxylic acid is a 1% oxalic acid solution.

16. The method of claim 12, wherein the chelating agent concentration is about 30 ppm.

* * * * *